United States Patent [19]

Smith

[11] Patent Number: 4,746,901
[45] Date of Patent: May 24, 1988

[54] HIGH PRECISION ANALOG TO DIGITAL CONVERTER

[75] Inventor: Richard D. Smith, Shelton, Conn.

[73] Assignee: ITT Corporation, New York, N.Y.

[21] Appl. No.: 766,095

[22] Filed: Aug. 15, 1985

[51] Int. Cl.$^4$ ............................................. H03K 13/02
[52] U.S. Cl. .......................... 340/347 AD; 340/347 M
[58] Field of Search .................... 340/347 AD, 347 M

[56] References Cited

U.S. PATENT DOCUMENTS

| | | | |
|---|---|---|---|
| 3,516,085 | 6/1970 | Dano | 340/347 AD |
| 4,124,844 | 11/1978 | Black et al. | 340/347 AD |
| 4,196,419 | 4/1980 | Brown | 340/347 AD |
| 4,308,524 | 12/1981 | Harrison et al. | 340/347 AD |
| 4,485,372 | 11/1984 | Holloway | 340/347 AD |
| 4,544,917 | 10/1985 | Lenhoff, Jr. | 340/347 AD |

Primary Examiner—William M. Shoop, Jr.
Assistant Examiner—Sharon D. Logan
Attorney, Agent, or Firm—Thomas L. Peterson

[57] ABSTRACT

There is disclosed an analog to digital converter for quantizing an analog signal. The analog to digital converter includes an input for receiving the analog signal and quantizing means coupled to the input for quantizing a first portion of the analog signal to one level of a first predetermined number of discrete levels. Second means coupled to the input causes the quantizing means to quantize the remaining portion of the analog signal to one sublevel of a second predetermined number of discrete sublevels.

22 Claims, 1 Drawing Sheet

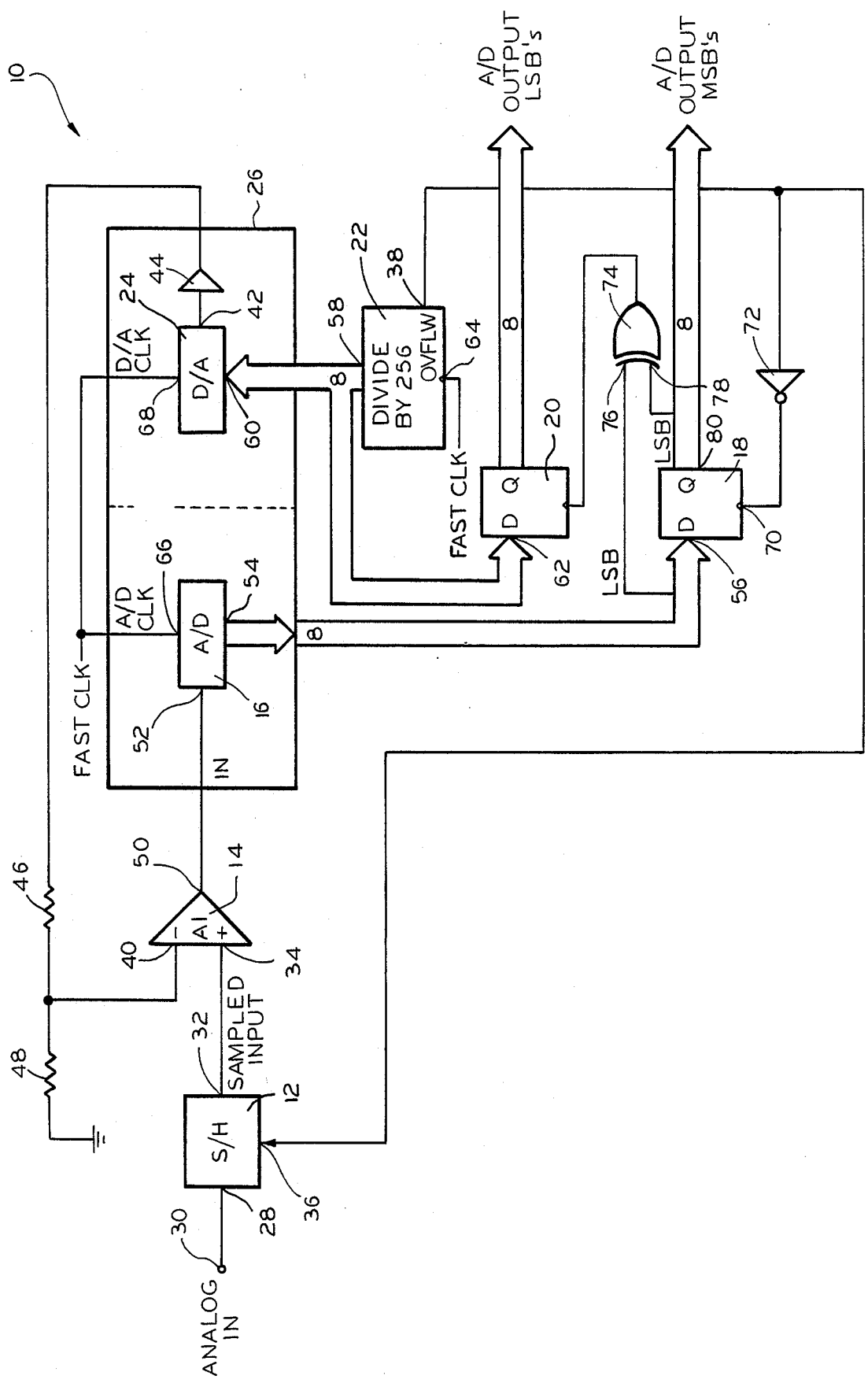

4,746,901

HIGH PRECISION ANALOG TO DIGITAL CONVERTER

BACKGROUND OF THE INVENTION

The present invention generally relates to an analog to digital converter, and more particularly to an analog to digital converter affording high precision at low cost.

High precision analog to digital converters find wide application in diverse fields such as telecommunications, industrial process control, robotics, medical and scientific instrumentation, and digital disc audio systems to name just a few. Even though prior art high precision analog to digital converters are costly, their use in the above mentioned fields is justified because of the overall costs of the systems in which they are employed, because there are few alternatives to their use, or because they still represent an overall price reduction to the ultimate user when compared to other alternatives.

One application, however, awaits a low cost high precision analog to digital converter. That application is in the field of home audio digital cassette tape recorders. Such systems have not utilized digital formats because the cost of the required high precision analog to digital converters has not allowed these systems to compete with the commercially accepted analog audio cassette tape recorder systems. This is indeed unfortunate because, as well known, digital audio provides recordings having broadened frequency response, wider dynamic range, and reduced noise. The present invention however, provides a high precision, low cost, analog to digital converter which can allow audio digital cassette tape recorders to compete with their analog counterparts.

SUMMARY OF THE INVENTION

The invention provides an analog to digital converter for quantizing an analog signal. The analog to digital converter includes input means for receiving the analog signal, quantizing means coupled to the input means for quantizing a first portion of the analog signal to one level of a first predetermined number of discrete levels, and second means coupled to the input means for causing the quantizing means to quantize the remaining portion of the analog signal to one sublevel of a second predetermined number of discrete sublevels.

The present invention more particularly provides an analog to digital converter for converting an analog signal to a digital binary bit word containing N bits. The analog to digital converter includes input means for receiving the analog signal and quantizing means coupled to the input means for quantizing a portion of the analog signal to one level of the first predetermined number of discrete levels represented by X binary bits. The X binary bits are the most significant bits of the N bit binary word. The analog to digital converter further includes second means coupled to the input means for incrementally decreasing the analog signal applied to the quantizing means to cause the quantizing means to quantize the remaining portion of the analog signal to one sublevel of a predetermined number of sublevels. The second means include least significant bit generating means for providing a Y bit binary word representing the one sublevel responsive to the quantizing means. The Y bit binary word provides the least significant bits of the N bit binary word.

DESCRIPTION OF THE DRAWING

The sole FIGURE illustrates in schematic circuit diagram form a high precision, low cost, analog to digital converter embodying the present invention.

DETAILED DESCRIPTION

Referring now to the sole figure, it illustrates an analog to digital converter 10 embodying the present invention. The analog to digital converter 10 is arranged for converting the amplitude of an analog signal to a digital binary bit word containing N bits, for example, 16 bits in accordance with this preferred embodiment.

The analog to digital converter 10 includes an input means comprising a sample-and-hold circuit 12 and a differential amplifier 14. The analog to digital converter further includes a quantizing means in the form of an 8 bit analog to digital converter 16, a first latch 18, a second latch 20, a divide-by 256 counter 22, and a digital to analog converter 24. The analog to digital converter 16 and digital to analog converter 24 are preferably contained within the same integrated circuit 26. One such integrated circuit which can be utilized for practicing the present invention is the UVC 3100 manufactured by ITT Semiconductors of Lawrence, Mass.

The sample-and-hold circuit 12 includes an input 28 which is coupled to a terminal 30 for receiving the analog signal having an amplitude to be quantized by the analog to digital converter. The output 32 of the sample-and-hold circuit 12 is coupled to the non-inverting input 34 of the differential amplifier 14. The sample-and-hold circuit 12 also includes an enable input 36 which is coupled to the output 38 of the counter 22.

The differential amplifier 14 includes an inverting input 40 which is coupled to the output 42 of the digital to analog converter 24 through an amplifier 44 and a resistor divider including resistors 46 and 48. The differential amplifier 14 further includes an output 50 which is coupled to the input 52 of the analog to digital converter 16.

The analog to digital converter 16 has an 8 bit output 54 which is coupled to the input 56 of the first latch 18. As will be described subsequently, the latch 18 stores the first 8 bits, or most significant bits, of the N bit binary word.

The clock 22 has an 8 bit output 58 coupled to an input 60 of the digital to analog converter 24 and to an input 62 of the second latch 20. As will be described subsequently, when the analog to digital converter 10 completes the quantitization of the amplitude of the analog signal, the second latch 20 will have stored therein the second 8 bits, or least significant bits, of the N bit binary word.

The counter 22 further includes a clock input 64 which is coupled to a clock (not shown) which provides fast clock signals. The clock (not shown) is also coupled to the clock inputs 66 and 68 of the analog to digital converter 16 and the digital to analog converter 24 respectively. In addition to being coupled to the sample-and-hold circuit 12, the output 38 of the counter 22 is coupled to an input 70 of the first latch 18 by an inverter 72.

The analog to digital converter 10 lastly includes an exclusive OR gate 74. The exclusive OR gate has an input 76 coupled to the input 56 of the latch 18 and another input 78 coupled to the output 80 of the latch 18.

In operation, when the analog signal is received at the terminal 30, it is transferred to the input 28 of the sample-and-hold circuit 12. The analog signal is then transferred from the output 32 of the sample-and-hold circuit 12 to the non-inverting input 34 of the differential amplifier 14. Because the inverting input 40 of the differential amplifier 14 is initially at zero, the entire amplitude of the analog signal to be quantized is fed to the analog to digital converter 16 at its input 52 wherein the first quantization takes place. The analog to digital converter 16 quantizes the analog signal to one level of 256 discrete levels and represents the quantized level of the analog signal in an 8 bit binary word at the output 54. The first quantization by the analog to digital converter 16 represents a quantization of a portion of the analog signal wherein the amplitude of that portion is represented by an 8 bit binary word at the output 54 of the analog to digital converter 16. That 8 bit binary word is transferred from the analog to digital converter 16 to the first latch 18 at its input 56. The 8 bit binary word is stored within the latch 18 and is held there until the completion of the entire conversion process. The 8 bit binary word within the latch 18 represents the most significant bits of the final 16 bit binary word representing the quantized level of the entire analog signal.

At this point the divide-by 256 counter 22 commences to increment the digital to analog converter 24. Each time the digital to analog converter 24 is incremented, the counter 22 presents a new 8 bit binary word to the digital to analog converter which converts the 8 bit binary words to analog signals. The analog signals are provided at the output 42 of the digital to analog converter 24, are scaled by the amplifier 44 and the resistor divider comprising resistors 46 and 48 and ultimately fed to the inverting input 40 of the differential amplifier 14. The digital to analog converter 24 provides a 0 to 2 volt output which is divided by the resistors 46 and 48 to provide a full-scale range of 0 to 2 divided by 256 volts. In other words, this full range is equal to one quantization level of the 8 bit analog to digital converter 16.

Each time the digital to analog converter 24 is incremented by the counter 22, the analog output at the output 42 of the digital to analog converter increases such that an increasing voltage is seen at the inverting input 40 of the differential amplifier 14. This increasing voltage, because it is applied to the inverting input 40, causes the output of the differential amplifier 50 to decrease such that the amplitude of the analog signal applied to the analog to digital converter 16 is decreased from its original value. Hence, the analog to digital converter 16 sees a decreasing voltage at its input 52. Also, each time the digital to analog converter 24 is incremented, the analog to digital converter 16 provides a new 8 bit binary word at its output 54. Also, at each incrementation the 8 bit binary word produced by the counter 22 is fed to the second latch 20 and represents the difference in amplitude between the original amplitude of the applied analog signal to be quantized and the level of the analog signal seen at the input of the analog to digital converter 16.

The foregoing process continues until the exclusive OR gate 74 senses when the decreasing analog signal at the input 52 of the analog to digital converter 16 is quantized at a level one less than the original level (the one being held in the most significant bit latch 18). When this occurs, the analog to digital converter 16 has finished quantizing the remaining portion of the original analog signal and this event is detected by the exclusive OR gate 74 which then freezes the current value of the counter 22 in the latch 20.

At this point, the latch 18 has stored therein an 8 bit binary word representing the most significant 8 bits of the 16 bit binary word and the latch 20 has stored therein an 8 bit binary word representing the last 8 bits or least significant bits of the 16 bit binary word. Even though the final 16 bit binary word is now determined, the counter is allowed to continue counting until it overflows in order to keep the timing periodic. When the counter 22 overflows, it provides the sample-and-hold circuit 12 at its input 36 with a pulse causing it to sample the next amplitude of the analog signal to be quantized to reinitiate the foregoing sequence.

It is to be noted that if the UVC 3100 is utilized for practicing the present invention, for AC applications only, the differential amplifier 14 can be replaced by clamping circuitry contained within the UVC 3100 integrated circuit and an external coupling capacitor. Also, in accordance with the present invention, the foregoing is not limited to 16 bits only. Other speed and precision combinations are possible.

The present invention offers an extremely low cost alternative for precision analog to digital conversion. This is made possible due to the availability of high speed analog to digital converters and digital to analog converters such as those found in the UVC 3100 which was developed for video applications. Hence, the present invention provides a high precision but low cost analog to digital converter for applications such as audio digital cassette tape recorders wherein heretofore such applications have not been possible with conventional analog to digital converters because of their high cost.

What is claimed is:

1. An analog to digital converter for quantizing an analog signal comprising:
   input means for receiving said analog signal;
   quantizing means coupled to said input means for quantizing said analog signal to one level of a first predetermined number of discrete levels representing a first portion of said analog signal; and
   second means coupled to said input means and to said quantizing means for incrementally decreasing said analog signal applied to said quantizing means and including means responsive to said quantizing means for providing a quantization of the remaining portion of said analog signal to one sublevel of a second predetermined number of discrete sublevels when said analog signal is decreased to a level which is one quantized discrete level less than said one level.

2. An analog to digital converter as defined in claim 1 further including first storing means for storing said one level in the form of most significant bits and second storing means for storing said one sublevel in the form of least significant bits.

3. An analog to digital converter as defined in claim 1 wherein said quantizing means comprises an analog to digital converter.

4. An analog to digital converter as defined in claim 1 wherein said second means comprises a digital to analog converter.

5. An analog to digital converter as defined in claim 1 wherein said second means includes a clock arranged to actuate said second means after said quantizing means quantizes said first portion of said analog signal.

6. An analog to digital converter as defined in claim 1 wherein said input means comprises a differential amplifier having an inverting input and a non-inverting input, and wherein said second means are coupled to said inverting input and said analog signal is received by said non-inverting input.

7. An analog to digital converter as defined in claim 6 wherein said differential amplifier has an output coupled to said quantizing means.

8. An analog to digital converter as defined in claim 1 wherein said input means includes a sample-and-hold circuit for maintaining said analog signal at said input means.

9. An analog to digital converter as defined in claim 1 wherein said second means is arranged to provide a signal to said input means for decreasing the level of said analog signal at said quantizing means.

10. An analog to digital converter as defined in claim 9 wherein said second means includes storing means for storing said one sublevel in response to said quantizing means quantizing said analog signal to a level which is one quantized discrete level less than said one level.

11. An analog to digital converter as defined in claim 10 wherein said second means includes a digital to analog converter for providing said analog signal decreasing signals and a counter coupled to said digital to analog converter for incrementing said digital to analog converter.

12. An analog to digital converter as defined in claim 11 wherein said counter is also coupled to said storing means for providing said storing means with said one sublevel.

13. An analog to digital converter as defined in claim 1 wherein said analog to digital converter is arranged to quantize said analog signal to N bits of accuracy, wherein said quantizing means is arranged to quantize said first portion of said analog signal to X bits of accuracy and wherein said second means is arranged to quantize said remaining portion to Y bits of accuracy, and wherein the sum of X and Y bits is equal to N bits.

14. An analog to digital converter as defined in claim 13 wherein said analog to digital converter is arranged to provide said quantization of said analog signal in an N bit digital word, wherein said X bits comprise the most significant bits of said digital word and wherein said Y bits comprise the least significant bits of said digital word.

15. An analog to digital converter for converting an analog signal to a digital binary bit word containing N bits, said analog to digital converter comprising:
input means for receiving said analog signal;
quantizing means coupled to said input means for quantizing said analog signal to one level of a first predetermed number of discrete levels represented by X binary bits, said X binary bits representing a first portion of said analog signal and being the most significant bits of said N bit binary word; and
second means coupled to said input means and to said quantizing means for incrementally decreasing said analog signal applied to said quantizing means and for providing a quantization of the remaining portion of said analog signal to one sublevel of a predetermined number of sublevels, said second means including least significant bit generating means for providing a Y bit binary word representing said one sublevel responsive to said quantizing means when said analog signal is decreased to a level which is one quantized discrete level less than said one level, said Y bit binary word being the least significant bits of said N bit binary word.

16. An analog to digital converter as defined in claim 15 wherein said input means include a differential amplifier having a non-inverting input for receiving said analog signal, an inverting input coupled to said second means, and an output coupled to said quantizing means.

17. An analog to digital converter as defined in claim 16 wherein said input means further include a sample-and-hold coupled between said analog signal and said differential amplifier non-inverting input for maintaining said analog signal at said non-inverting input.

18. An analog to digital converter as defined in claim 15 wherein said least significant bit generating means include a counter for incrementing said second means.

19. An analog to digital converter as defined in claim 18 wherein said second means further includes a latch coupled to said counter for storing said Y bit binary word responsive to said quantizing means.

20. An analog to digital converter as defined in claim 15 further including a latch coupled to said quantizing means for storing said X binary bits.

21. An analog to digital converter as defined in claim 15 wherein said quantizing means comprises an analog to digital converter having an accuracy of less than said N bits.

22. An analog to digital converter as defined in claim 16 wherein said second means comprises a digital to analog converter having an output coupled to said differential amplifier inverting input.

* * * * *